(12) United States Patent
Fork et al.

(10) Patent No.: US 7,922,471 B2
(45) Date of Patent: Apr. 12, 2011

(54) EXTRUDED STRUCTURE WITH EQUILIBRIUM SHAPE

(75) Inventors: David K. Fork, Los Altos, CA (US); Thomas S. Zimmerman, Jena (DE)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1033 days.

(21) Appl. No.: 11/555,496

(22) Filed: Nov. 1, 2006

(65) Prior Publication Data

US 2008/0099953 A1    May 1, 2008

(51) Int. Cl.
*B29C 47/06*    (2006.01)

(52) U.S. Cl. .................. 425/133.5; 425/192 R; 425/375; 425/378.1; 425/462

(58) Field of Classification Search ............... 425/133.5, 425/192 R, 224, 375, 376.1, 378.1, 461, 462
See application file for complete search history.

(56) References Cited

U.S. PATENT DOCUMENTS

| | | |
|---|---|---|
| 2,031,387 A | 2/1936 | Schwarz |
| 2,789,731 A | 4/1957 | Marraffino |
| 3,032,008 A | 5/1962 | Land et al. |
| 3,159,313 A | 12/1964 | Guilford |
| 3,602,193 A | 8/1971 | Adams et al. |
| 3,973,994 A | 8/1976 | Redfield |
| 3,988,166 A | 10/1976 | Beam |
| 4,018,367 A | 4/1977 | Morine et al. |
| 4,021,267 A | 5/1977 | Dettling |
| 4,045,246 A | 8/1977 | Mlavsky et al. |
| 4,053,327 A | 10/1977 | Meulenberg, Jr. |
| 4,084,985 A | 4/1978 | Evans, Jr. |
| 4,086,485 A | 4/1978 | Kaplow et al. |
| 4,095,997 A | 6/1978 | Griffiths |
| 4,119,058 A | 10/1978 | Schmermund |

(Continued)

FOREIGN PATENT DOCUMENTS

CN    2606309 Y    3/2004

(Continued)

OTHER PUBLICATIONS

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

(Continued)

*Primary Examiner* — Matthew J Daniels
*Assistant Examiner* — Joseph Leyson
(74) *Attorney, Agent, or Firm* — Bever, Hoffman & Harms, LLP; Patrick T. Bever

(57) ABSTRACT

An extrusion head is disposed over a substrate, and material is extruded through an oblique (e.g., semi-circular or tapered) outlet orifice of the extrusion head to form an associated extruded structure having an equilibrium shape that resists settling after being deposited on the substrate. The extrusion head includes fluidic channels having a flat surface formed by a flat first (e.g., metal) sheet, and an oblique (e.g., substantially semi-cylindrical) surface formed by elongated oblique trenches that are etched or otherwise formed in a second sheet. The fluidic channel communicates with the outlet orifice, which has a flat edge formed by the first sheet, and an oblique edge formed by an end of the oblique trench. The material is extruded through the outlet orifice such that its flat lower surface contacts the substrate, and its oblique upper surface faces away from the substrate. Two materials are co-extruded to form high aspect-ratio gridlines.

3 Claims, 8 Drawing Sheets

U.S. PATENT DOCUMENTS

| | | |
|---|---|---|
| 4,131,485 A | 12/1978 | Meinel et al. |
| 4,141,231 A | 2/1979 | Kudlich |
| 4,148,301 A | 4/1979 | Cluff |
| 4,153,476 A | 5/1979 | Frosch et al. |
| 4,177,083 A | 12/1979 | Kennedy |
| 4,221,468 A | 9/1980 | Macken |
| 4,224,081 A | 9/1980 | Kawamura et al. |
| 4,254,894 A | 3/1981 | Fetters |
| 4,331,703 A | 5/1982 | Lindmayer |
| 4,337,758 A | 7/1982 | Meinel et al. |
| 4,355,196 A | 10/1982 | Chai |
| 4,461,403 A | 7/1984 | Prahs |
| 4,476,165 A | 10/1984 | McIntyre |
| 4,490,418 A | 12/1984 | Yoshida |
| 4,521,457 A | 6/1985 | Russell et al. |
| 4,540,843 A | 9/1985 | Gochermann et al. |
| 4,602,120 A | 7/1986 | Wakefield et al. |
| 4,683,348 A | 7/1987 | Pidgeon et al. |
| 4,746,370 A | 5/1988 | Woolf |
| 4,747,517 A | 5/1988 | Hart |
| 4,792,685 A | 12/1988 | Yamakawa |
| 4,796,038 A | 1/1989 | Allen et al. |
| 4,826,777 A | 5/1989 | Ondris |
| 4,841,946 A | 6/1989 | Marks |
| 4,847,349 A | 7/1989 | Ohta et al. |
| 4,849,028 A | 7/1989 | Krause |
| 4,855,884 A | 8/1989 | Richardson |
| 4,938,994 A | 7/1990 | Choinski |
| 4,947,825 A | 8/1990 | Moriarty |
| 4,952,026 A | 8/1990 | Bellman et al. |
| 5,000,988 A | 3/1991 | Inoue et al. |
| 5,004,319 A | 4/1991 | Smither |
| 5,011,565 A | 4/1991 | Dube et al. |
| 5,062,899 A | 11/1991 | Kruer |
| 5,075,281 A | 12/1991 | Testardi |
| 5,089,055 A | 2/1992 | Nakamura |
| 5,120,484 A * | 6/1992 | Cloeren .................. 264/173.12 |
| 5,151,377 A | 9/1992 | Hanoka et al. |
| 5,167,724 A | 12/1992 | Chiang |
| 5,180,441 A | 1/1993 | Cornwall et al. |
| 5,188,789 A | 2/1993 | Nishiura |
| 5,213,628 A | 5/1993 | Noguchi et al. |
| 5,216,543 A | 6/1993 | Calhoun |
| 5,254,388 A | 10/1993 | Melby et al. |
| 5,344,496 A | 9/1994 | Stern et al. |
| 5,353,813 A | 10/1994 | Deevi et al. |
| 5,356,488 A | 10/1994 | Hezel |
| 5,389,159 A | 2/1995 | Kataoka et al. |
| 5,449,413 A | 9/1995 | Beauchamp et al. |
| 5,501,743 A | 3/1996 | Cherney |
| 5,529,054 A | 6/1996 | Shoen |
| 5,536,313 A | 7/1996 | Watanabe et al. |
| 5,538,563 A | 7/1996 | Finkl |
| 5,540,216 A | 7/1996 | Rasmusson |
| 5,543,333 A | 8/1996 | Holdermann |
| 5,552,820 A | 9/1996 | Genovese |
| 5,559,677 A | 9/1996 | Errichiello |
| 5,560,518 A | 10/1996 | Catterall et al. |
| 5,569,399 A | 10/1996 | Penney et al. |
| 5,590,818 A | 1/1997 | Raba et al. |
| 5,665,175 A | 9/1997 | Safir |
| 5,700,325 A | 12/1997 | Watanabe |
| 5,733,608 A | 3/1998 | Kessel et al. |
| 5,873,495 A | 2/1999 | Saint-Germain |
| 5,918,771 A | 7/1999 | van der Heijden |
| 5,929,530 A | 7/1999 | Stone |
| 5,949,123 A | 9/1999 | Le et al. |
| 5,981,902 A | 11/1999 | Arita et al. |
| 5,990,413 A | 11/1999 | Ortabasi |
| 6,008,449 A | 12/1999 | Cole |
| 6,011,307 A | 1/2000 | Jiang et al. |
| 6,020,554 A | 2/2000 | Kaminar et al. |
| 6,032,997 A | 3/2000 | Elliott et al. |
| 6,047,862 A | 4/2000 | Davies |
| 6,091,017 A | 7/2000 | Stern |
| 6,118,067 A | 9/2000 | Lashley et al. |
| 6,130,465 A | 10/2000 | Cole |
| 6,140,570 A | 10/2000 | Kariya |
| 6,164,633 A | 12/2000 | Mulligan et al. |
| 6,203,621 B1 | 3/2001 | Tran et al. |
| 6,232,217 B1 | 5/2001 | Ang et al. |
| 6,257,450 B1 | 7/2001 | Jackson et al. |
| 6,274,508 B1 | 8/2001 | Jacobsen et al. |
| 6,278,054 B1 | 8/2001 | Ho et al. |
| 6,293,498 B1 | 9/2001 | Stanko et al. |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,379,521 B1 | 4/2002 | Nishio |
| 6,398,370 B1 | 6/2002 | Chiu et al. |
| 6,407,329 B1 | 6/2002 | Iino et al. |
| 6,410,843 B1 | 6/2002 | Kishi et al. |
| 6,418,986 B1 | 7/2002 | Gabriele |
| 6,420,266 B1 | 7/2002 | Smith et al. |
| 6,423,140 B1 | 7/2002 | Liu et al. |
| 6,429,037 B1 | 8/2002 | Wenham et al. |
| 6,479,395 B1 | 11/2002 | Smith et al. |
| 6,527,964 B1 | 3/2003 | Smith et al. |
| 6,531,653 B1 | 3/2003 | Glenn et al. |
| 6,555,739 B2 | 4/2003 | Kawam |
| 6,558,146 B1 * | 5/2003 | Shah et al. .................... 425/113 |
| 6,568,863 B2 | 5/2003 | Murata |
| 6,590,235 B2 | 7/2003 | Carey et al. |
| 6,597,510 B2 | 7/2003 | Bunkenburg et al. |
| 6,623,579 B1 | 9/2003 | Smith et al. |
| 6,663,944 B2 | 12/2003 | Park et al. |
| 6,666,165 B2 | 12/2003 | Shiraishi et al. |
| 6,667,434 B2 | 12/2003 | Morizane et al. |
| 6,743,478 B1 | 6/2004 | Kiiha et al. |
| 6,890,167 B1 | 5/2005 | Kwok et al. |
| 6,896,381 B2 | 5/2005 | Benitez et al. |
| 6,924,493 B1 | 8/2005 | Leung |
| 7,045,794 B1 | 5/2006 | Spallas et al. |
| 7,101,592 B2 | 9/2006 | Gueggi et al. |
| 7,152,985 B2 | 12/2006 | Benitez et al. |
| 7,160,522 B2 | 1/2007 | Minano Dominguez et al. |
| 7,181,378 B2 | 2/2007 | Benitez et al. |
| 7,388,147 B2 | 6/2008 | Mulligan et al. |
| 7,394,016 B2 | 7/2008 | Gronet |
| 2001/0008230 A1 | 7/2001 | Keicher et al. |
| 2002/0056473 A1 | 5/2002 | Chandra et al. |
| 2002/0060208 A1 | 5/2002 | Liu et al. |
| 2002/0148497 A1 | 10/2002 | Sasaoka et al. |
| 2002/0149107 A1 | 10/2002 | Chang et al. |
| 2002/0154396 A1 | 10/2002 | Overbeck |
| 2003/0015820 A1 | 1/2003 | Yamazaki et al. |
| 2003/0095175 A1 | 5/2003 | Agorio |
| 2003/0129810 A1 | 7/2003 | Barth et al. |
| 2003/0201581 A1 | 10/2003 | Weber et al. |
| 2003/0232174 A1 | 12/2003 | Chang et al. |
| 2004/0012676 A1 | 1/2004 | Weiner |
| 2004/0031517 A1 | 2/2004 | Bareis |
| 2004/0048001 A1 | 3/2004 | Kiguchi et al. |
| 2004/0070855 A1 | 4/2004 | Benitez et al. |
| 2004/0084077 A1 | 5/2004 | Aylaian |
| 2004/0151014 A1 | 8/2004 | Speakman |
| 2004/0191422 A1 | 9/2004 | Kataoka |
| 2004/0200520 A1 | 10/2004 | Mulligan et al. |
| 2004/0211460 A1 | 10/2004 | Simburger et al. |
| 2004/0265407 A1 * | 12/2004 | Prugh et al. ................ 425/133.5 |
| 2005/0000566 A1 | 1/2005 | Posthuma et al. |
| 2005/0029236 A1 | 2/2005 | Gambino et al. |
| 2005/0034751 A1 | 2/2005 | Gross et al. |
| 2005/0046977 A1 | 3/2005 | Shifman |
| 2005/0067729 A1 | 3/2005 | Laver et al. |
| 2005/0081908 A1 | 4/2005 | Stewart |
| 2005/0133084 A1 | 6/2005 | Joge et al. |
| 2005/0194037 A1 | 9/2005 | Asai |
| 2005/0221613 A1 | 10/2005 | Ozaki et al. |
| 2005/0253308 A1 | 11/2005 | Sherwood |
| 2006/0207650 A1 | 9/2006 | Winston et al. |
| 2006/0231133 A1 | 10/2006 | Fork et al. |
| 2006/0251796 A1 | 11/2006 | Fellingham |
| 2006/0266235 A1 | 11/2006 | Sandhu et al. |

| | | | |
|---|---|---|---|
| 2007/0110836 A1* | 5/2007 | Fork et al. | 425/133.5 |
| 2008/0047605 A1 | 2/2008 | Benitez et al. | |
| 2008/0138456 A1 | 6/2008 | Fork et al. | |

FOREIGN PATENT DOCUMENTS

| | | |
|---|---|---|
| CN | 1854637 A | 11/2006 |
| DE | 197 35 281 A1 | 2/1999 |
| EP | 0 257 157 A | 3/1988 |
| EP | 0 851 511 A | 7/1998 |
| EP | 1 145 797 A | 10/2001 |
| EP | 1351318 A | 10/2003 |
| EP | 1 715 260 A | 10/2006 |
| EP | 1 763 086 A | 3/2007 |
| EP | 1 787 786 A | 5/2007 |
| EP | 1 833 099 A | 9/2007 |
| JP | 60082680 A | 5/1985 |
| JP | 02 187291 A | 7/1990 |
| JP | 2002111035 A | 4/2002 |
| JP | 2004-266023 A | 9/2004 |
| JP | 2005051216 | 2/2005 |
| WO | WO 91/08503 A | 6/1991 |
| WO | WO 91/15355 | 10/1991 |
| WO | WO 92/15845 A | 9/1992 |
| WO | WO 94/28361 A1 | 12/1994 |
| WO | WO 97/21253 A | 6/1997 |
| WO | WO 97/48519 A | 12/1997 |
| WO | WO 00/49421 A1 | 8/2000 |
| WO | WO 00/49658 A1 | 8/2000 |
| WO | WO 00/50215 | 8/2000 |
| WO | WO 02/052250 A | 7/2002 |
| WO | WO 02/097724 A1 | 12/2002 |
| WO | WO 03/047005 A | 6/2003 |
| WO | WO 03/076701 A | 9/2003 |
| WO | WO 2005/070224 A1 | 8/2005 |
| WO | WO 2005/107957 A1 | 11/2005 |
| WO | WO 2005/107958 A1 | 11/2005 |
| WO | WO 2006/097303 A | 9/2006 |
| WO | WO 2007/104028 | 9/2007 |

OTHER PUBLICATIONS

U.S. Appl. No. 11/282,882, filed Nov. 17, 2005.
U.S. Appl. No. 11/282,829, filed Nov. 17, 2005.
U.S. Appl. No. 11/336,714, filed Jan. 20, 2006.
Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.
Cuevas et al. "50 Per Cent More Output Power from an Albedo-Collecting Flat Panel Using Bifacial Solar Cells", *Solar Energy*, vol. 29, No. 5, pp. 419-420, 1982.
Finlayson et al. "$Bi_2O_3$-$Wo_3$ compounds for photocatalytic applications by solid state and viscous processing", Title from a conference scheduled for Oct. 6-7, 2004 in Munich, 8 pages.
Kerschaver et al. "Back-contact Solar Cells: A Review," Progress in Photovoltaics: Research and Applications, 2006, vol. 14, pp. 107-123.
Kränzl et al. "Bifacial Solar Cells on Multi-Crystalline Silicon", 15th International Photovoltaic Science & Engineering Conference, Shanghai, China, 2 pages, 2005.
Mueller et al. "Breathable Polymer Films Produced by the Microlayer Coextrusion Process", Journal of Applied Polymer Science, vol. 78, pp. 816-828, 2000.
Neuhaus et al. "Industrial Silicon Wafer Solar Cells," Advances in OptoElectronics, vol. 2007, 2007, 15 pages.
Rao et al. "Microfabricated Deposition Nozzles for Direct-Write Assembly of Three-Dimensional Periodic Structures", *Advanced Materials*, vol. 17, No. 3, Feb. 10, 2005, 5 pages.
Recart et al. "Large Area Thin BSF Solar Cells With Simultaneously Diffused Boron and Phosphorus Screen Printed Emitters", IEEE, pp. 1213-1216, 2005.
Taguchi et al. An Approach for the Higher Efficiency in the HIT Cells, IEEE, pp. 866-871, 2005.
Van Hoy et al. "Microfabrication of Ceramics by Co-extrusion", *J. Am. Ceram. Soc.*, vol. 81, No. 1, pp. 152-158, 1998.
Weber et al. "Modelling of Sliver® Modules Incorporating a Lambertian Rear Reflector", The Australian National University, Canberra ACT 0200, Australia, 4 pages, 2005.
Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.
Extrusion/Coextrusion Dies, Extrusion Dies Industries, LLC, http://www.extrusiondies.com/PRODUCTS/ExtrusionDies/multimanifoldDies.html, 1 page, Sep. 15, 2005.
Hitachi: Offering Total Environmental Solutions, Environmental Activities, http://greenweb.hitachi.co.jp/en/sustainable/total-solution.html, 5 pages, 2003.
Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.
SunPower Corp. News Release, May 12, 2008, Available URL: http://investors.sunpowercorp.com/releasedetail.cfm?ReleaseID=309613.
Sparber et al. "Comparison of texturing methods for monocrystalline silicon solar cells using KOH and $Na_2CO_3$," 3rd World Conf. Photovoltaic Energy Conversion, Osaka, 2003, pp. 1372-1375.
MacDonald et al. "Texturing industrial multicrystalline silicon solar cells," Solar Energy, vol. 76, 2004, pp. 277-283.
Tool et al. "Straightforward in-line processing for 16.8% efficient mc-Si solar cells," 31st IEEE Photovoltaic Specialists Conf., Florida, 2005, pp. 1324-1327.
Fukui et al. "17.7% efficiency large area multicrystalline silicon solar cell using screen-printed metallization technique," 31st IEEE Photovoltaic Specialists Conf., Florida, 2005, pp. 979-982.
Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/me10705.pdf.
Zhao et al. "19.8% efficient 'honeycomb' textured multicrystalline and 24.4% monocrystalline silicon solar cells," Applied Physics Letters, vol. 73, pp. 1991-1993, 1998.
Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.
Murphy, Jr. "Home photovoltaic systems for physicists," *Physics Today*, Jul. 2008, pp. 42-47.
Brogren et al. "Optical properties, durability, and system aspects of a new aluminum-polymer-laminated steel reflector for solar concentrators", Jan. 2004, Solar Energy Materials and Solar Cells, 82, pp. 387-412.
Mauk et al. "'Buried' Metal/Dielectric/Semiconductor Reflectors for Light Trapping in Epitaxial Thin-Film Solar Cells", May 1996, IEEE, 25th PVSC, pp. 147-150.
Munzer et al. "Thin Monocrystalline Silicon Solar Cells, Oct. 1999, IEEE Transactions on Electron Devices", vol. 46, No. 10, pp. 2055-2061.
Knight et al. "Hydrodynamic Focusing on a Silicon Chip: Mixing Nanoliters in Microseconds", Physical Review Letters, vol. 80, No. 17, Apr. 27, 1998, pp. 3863-3866.
Raabe et al. "High Aspect Ratio Screen Printed Fingers", 20th European Solar Energy Conference and Exhibition, Barcelona, Spain, Jun. 6-10, 2005, 4 pages.
Bejan, A. "Chapter Five, Buckling Flows: A New Frontier in Fluid Mechanics," Annual Review of Numerical Fluid Mechanics and Heat Transfer, vol. 1, Ed. T. C. Chawla, Hemisphere Publishing Corporation, 1987, pp. 262-304.
Liang et al. "Co-Extrusion of Solid Oxide Fuel Cell Functional Elements", Ceramic Engineering and Science Proceedings, vol. 20, No. 4, 1999, pp. 587-594.
Shannon et al. "The Production of Alumina/Zirconia Laminated Composites by Co-Extrusion", Ceramic Engineering and Science Proceedings, vol. 16, No. 5, 1955, pp. 1115-1120.
Kenis et al. "Microfabrication Inside Capillaries Using Multiphase Laminar Flow Patterning", Science, vol. 285, Jul. 2, 1999, pp. 83-85.
Szlufcik et al. "Low-Cost Industrial Technologies of Crystalline Silicon Solar Cells", Proc. of the IEEE, vol. 85, No. 5, May 1, 1997, pp. 711-730.

Ruthe et al. "Etching of CuInSe2 Thin Films-Comparison of Femtosecond and Picosecond Laser Ablation", Applied Surface Science, vol. 247, No. 1-4, Jul. 15, 2005, pp. 447-452.

Alvarez et al. "RXI Concentrator for 1000X Photovoltaic Energy Conversion".

Benitez et al. "High-Concentration Mirror-Based Kohler Integrating System for Tandem Solar Cells", WCPEC2006, 4 pages.

Bett et al. "FLATCON™ and FLASHCON™ Concepts for High Concentration PV", Presented at the 19th European Photovoltaic Solar Energy Conf., Jun. 7-11, 2004, Paris, 4 pages.

Gordon et al. "Optical performance at the thermodynamic limit with tailored imaging designs", Applied Optics, in press, Dec. 2004, 16 pages.

Kenis et al. "Fabrication inside Microchannels Using Fluid Flow", Accounts of Chemical Research, vol. 33, No. 12, 2000, pp. 841-847.

Mulligan et al. "A Flat-Plate Concentrator: Micro-Concentrator Design Overview", 2000 IEEE, pp. 1495-1497.

Mulligan et al. "Development of Chip-Size Silicon Solar Cells".

Nguyen, Luu "Wafer Level Packaging for Analog/Mixed Signal Applications", MEPTEC Int. Wafer Level Packaging Conference, Aug. 22, 2002, 41 pages.

Sun et al. "Modeling and Experimental Evaluation of Passive Heat Sinks for Miniature High-Flux Photovoltaic Concentrators", Transactions of the ASME, vol. 127, pp. 138-145 (2005).

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Swanson, Richard M. "The Promise of Concentrators", Prog. Photovolt. Res. Appl. 8, pp. 93-111 (2000).

Terao et al. "A Mirror-Less Design for Micro-Concentrator Modules", Conference Record of the 28th IEEE Photovoltaic Specialists Conference (2000) pp. 1416-1419.

Terao, Akira "MicroDish: A Novel Reflective Optic for Flat-Plate Micro-Concentrator", SPIE's 49th Annual Meeting, Aug. 2-6, 2004, Denver, Colorado, USA, 9 pages.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

* cited by examiner

EXTRUDED STRUCTURE WITH EQUILIBRIUM SHAPE

FIELD OF THE INVENTION

The present invention is related to extrusion systems and methods, and more particularly to micro extrusion systems and methods for co-extruding multiple similar and/or dissimilar materials to form relatively fine structures with relatively high aspect ratios.

BACKGROUND

With traditional extrusion a billet of material is pushed and/or drawn through a die to create a rod, rail, pipe, etc. Various applications leverage this capability. For instance, extrusion can be used with food processing applications to create pasta, cereal, snacks, etc., pipe pastry filling (e.g., meringue), pattern cookie dough on a cookie pan, generate pastry flowers and borders on cakes, etc. In another application, extrusion can be used with consumer goods, for example, to merge different colored toothpastes together on a toothbrush.

FIG. 11 is a perspective view showing an extrusion head 30 of a conventional micro extrusion system for producing fine featured (e.g., less than 50 micron width and height) structures 20 on the upper surface 102 of a substrate 101. Extrusion head 30 that includes metal plates 31, 32 and 33 that are laminated together using known high pressure wafer bonding techniques, with one or more of the plates being processed to define a fluidic channel 34 that communicates with an outlet orifice 35 that is defined on a side edge of the head. Extrusion material is inserted into fluidic channels 34 through an input port 37 such that the extrusion materials are shaped and extruded through outlet orifice 35, from which they are dispensed onto a target structure (e.g., upper surface 102 of substrate 101).

FIGS. 12(A) and 12(B) are cross sectional side views illustrating a typical production problem associated with conventional micro extrusion systems. FIG. 12(A) shows an idealized high aspect-ratio extruded structure 20A formed on substrate 101 using the conventional micro extrusion techniques described above, with idealized extruded structure 20A having the square or rectangular shape of outlet orifice 35. For purposes of explanation, idealized extruded structure 20A that has a relatively narrow width W1 and a relatively large height H. A problem with the production of micro extrusion structures is that the extruded material is necessarily a fluid (i.e., liquid or paste), and as such is subjected to settling after being extruded. Therefore, the ideal rectangular shape shown in FIG. 12(A) typically settles due to its characteristics as a fluid, as indicated by the arrows shown in FIG. 12(B), causing the idealized high aspect-ratio gridline structure 20B to assume a slumped shape having at least one of a wider width W2 and a reduced height H2. This reduction in height and increase in width is undesirable in, for example, solar cell production where the extruded structure can be used to form metal gridlines because the settled structure allows less sunlight to enter substrate 101, and more sunlight (depicted by dashed-line arrows) is reflected away from substrate 101. Consequently, conventional micro extrusion techniques are limited, for example, in that they cannot render relatively high aspect-ratio (e.g., 1:1 or greater) or porous structures for a cost below $1/sq. ft. Thus, extrusion typically is not used for creating conducting contacts and/or channels for electrochemical (e.g., fuel), solar, and/or other types of cells, which leverage high aspect-ratio fine featured porous structures to increase efficiency and electrical power generation.

Another practical device that benefits from rapid and economical means for generating high aspect ratio lines and features include plasma display panels, such as that shown in FIG. 13, where high aspect-ratio barrier ribs define the sub-pixels within the display. The barrier rib is an electrically insulating structure, and is preferably a high aspect ratio structure, as this improves the dot per inch resolution and fill factor of the display. The settling problem discussed above with reference to FIG. 12(B) results in non-optimal barrier ribs that produce inferior display devices.

What is needed is a system and method for efficiently producing micro extrusion structures that can be used, for example, in the production of high quality photovoltaic cells and plasma display panels.

SUMMARY OF THE INVENTION

The present invention is directed to an apparatus and a method for forming high-aspect ratio functional structures (e.g., "gridlines") on a substrate surface in which the gridlines are extruded through an orifice of an extrusion head, wherein the orifice has an oblique (e.g., curved or tapered) upper surface that causes the gridlines to have a curved or tapered upper surface immediately upon extrusion. The extrusion head is fabricated using several (e.g., metal) sheets that are bonded or otherwise laminated together. One of the sheets is etched to define the oblique surface of the orifice, and that sheet is then bonded to a second sheet to provide a flat lower surface of the orifice. In accordance with the present invention, the oblique upper surface of the orifice is formed such that the gridlines are substantially in equilibrium immediately after being extruded, thus preventing undesirable subsequent settling that increases the width and reduces the height.

In accordance with an embodiment of the present invention, a gridline (functional) material is co-extruded with a support (e.g., sacrificial) material onto the substrate surface such that the high-aspect ratio gridline is supported between two support material portions (in one embodiment the support portions are treated as sacrificial portions that are subsequently removed). The formation of such co-extruded structures requires the compression of the gridline material between the two support material portions, which requires the use of a relatively wide three-channel cavity feeding a relatively narrow outlet orifice in a manner that compresses the gridline material between the two support material portions. By forming the composite extruded structure with an equilibrium shape, the present invention facilitates the reliable production of high aspect-ratio gridlines.

In accordance with an embodiment of the present invention, a method for manufacturing an extrusion head for a micro extrusion apparatus includes etching a first sheet to include an elongated trench having an oblique (e.g., generally semi-cylindrical or tapered) shape. The trench has a closed end, and extends to a side edge of the sheet. A second sheet is etched to include an inlet port that is positioned to align with the closed end of the trench when the first and second sheets are bonded together. The oblique trench is thus formed in a reliable and economical manner, and serves to provide an orifice having an oblique surface that is defined in a side edge of the extrusion head.

BRIEF DESCRIPTION OF THE DRAWINGS

These and other features, aspects and advantages of the present invention will become better understood with regard to the following description, appended claims, and accompanying drawings, where:

DETAILED DESCRIPTION

Figure 1:
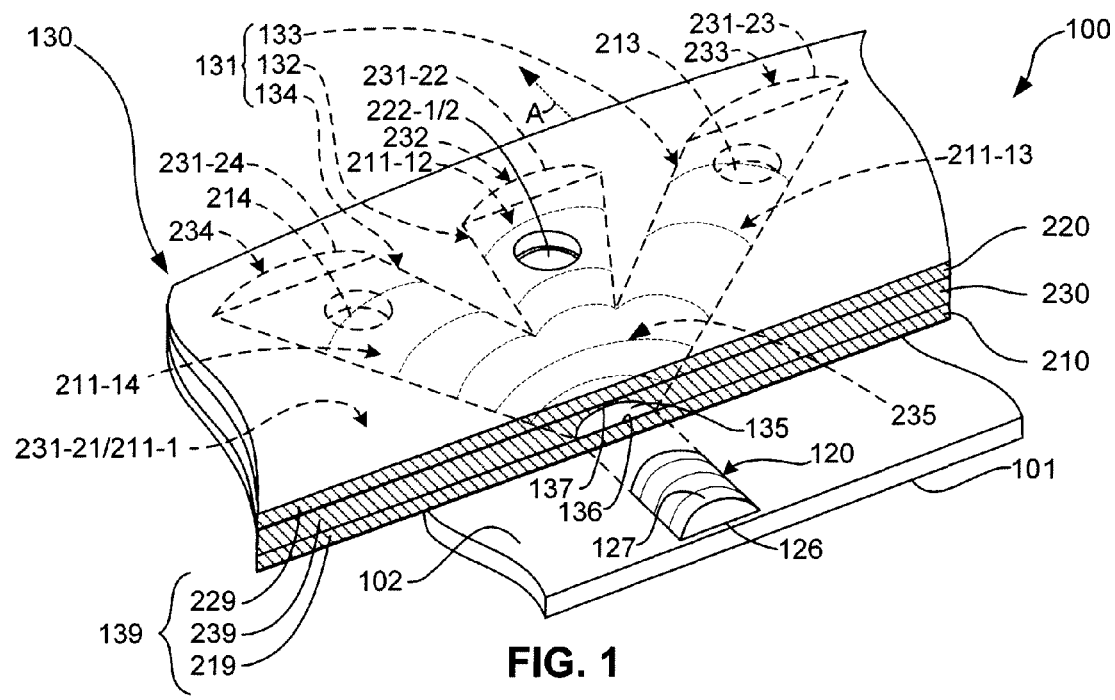
FIG. 1 is an assembled perspective view showing a portion of a co-extrusion head of a micro extrusion system according to an embodiment of the present invention.

FIG. 1 illustrates a portion of an extrusion head 130, which makes up part of a micro extrusion apparatus 100 for producing an extruded structures 120 having an equilibrium shape on a substrate 101 in accordance with an embodiment of the present invention. Extrusion head 130 is operably coupled to one or more sources (not shown) of extrusion materials such that the material is extruded from an outlet orifice 135 defined in a side edge 139 of extrusion head 130, and is deposited onto the upper surface 102 of substrate 101 with the desired equilibrium shape that resists settling after extrusion.

Figure 2:
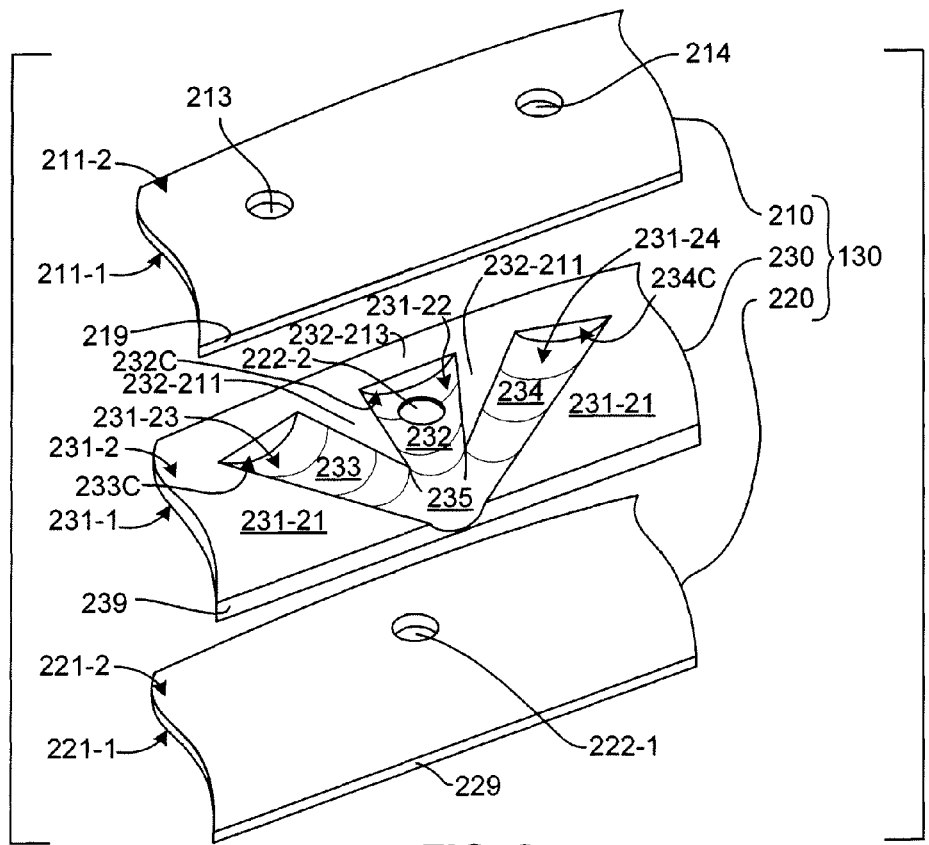
FIG. 2 is an exploded perspective view showing the portion of the co-extrusion head of FIG. 1.

FIG. 2 is an exploded perspective view showing extrusion head 130 in additional detail. In accordance with an embodiment of the present invention, extrusion head 130 is made up of multiple sheets (substrates or plates) 210, 220 and 230 that, in one embodiment, are bonded using known high pressure wafer bonding techniques to form the substantially solid, block-like structure shown in FIG. 1. In one embodiment, sheets 210, 220 and 230 are metal plates having a thickness of approximately 0.15 mm. Each of the sheets has opposing sides and a substantially straight side edge--sheet 210 has opposing first and second surfaces 211-1 and 211-2 and a side edge 219, sheet 220 has opposing surfaces 221-1 and 221-2 and a side edge 229, and sheet 230 has opposing surfaces 231-1 and 231-2 and a side edge 239. Sheets 210, 220, and 230 are bonded such that sheet 230 is sandwiched between sheet 210 and 220, with sheet 230 being mounted on sheet 220 such that surface 231-1 faces surface 221-2, and sheet 210 being mounted on sheet 230 such that (first) surface 211-1 faces (second) surface 231-2. Sheets 210, 220 and 230 are assembled or processed (e.g., by one or more of cutting, milling or grinding) such that side edges 219, 229 and 239 are aligned to form a edge surface 139 of extrusion head 130, as indicated in FIG. 1. A method for fabricating head 130 is described in co-owned and co-pending U.S. patent application Ser. No. 11/555,512, now U.S. Pat. No. 7,780,812, entitled "EXTRUSION HEAD WITH PLANARIZED EDGE SURFACE", which is incorporated herein by reference in its entirety.

Referring again to FIG. 2, in accordance with an aspect of the present invention, sheet 230 is etched or otherwise manufactured to include at least one of elongated trenches 232, 233 and 234 that are defined in surface 232-2, and extending from an open end (notch) 235 located adjacent to side edge 239 to closed ends 232C, 233C and 234C disposed away from side edge 239. Each trench 232, 233 and 234 has a concave oblique (e.g., generally semi-cylindrical or tapered) surface that is formed in the manner described below. Specifically, trench 232 includes an oblique surface 231-22 extending between closed end 232C and open end 235, trench 233 includes an oblique surface 231-23 extending between closed end 233C and open end 235, and trench 234 includes an oblique surface 231-24 extending between closed end 234C and open end 235. When sheet 230 is subsequently bonded to sheet 210, planar flat portions 231-21 of second surface 232-2 abut first surface 211-1 of sheet 210, and each trench 232, 233 and 234 combines with opposing flat portions 211-12, 211-13 and 211-14, respectively, of surface 211-1 to form a generally semi-cylindrical fluidic channel (e.g., fluidic channels 132, 133, 134, indicated in FIG. 1), with each fluidic channel communicating with an associated outlet orifice 135.

In accordance with another aspect of the invention, outlet orifice 135 includes a straight edge 136 that is defined by the portion of flat surface 211-1 located at side edge 219 of sheet 210, and an oblique second edge 137 defined by end portions of oblique surfaces 232-22, 232-23, and/or 232-24 that are located at side edge 239 of sheet 230. Oblique edge 137 facilitates the production of extruded structures having an equilibrium shape in the manner described below.

In accordance with an embodiment of the present invention, trenches 232, 233 and 234 are arranged in an arrowhead-shaped pattern such that, when extrusion head 130 is assembled, a fluidic channel 130-1 is formed as a three-channel cavity having central channel 132 positioned between opposing (first and second) side channels 133 and 134, with all three channels communicating with output port 135. In particular, at their respective closed ends, central trench 232 is separated from side trenches 233 and 234 by tapered finger-like flat portions 232-211 and 232-212, respectively, and trench 232 is closed by an end flat portion 232-313, thereby form central channel 132 when sheets 210 and 230 are combined. Similarly, side trenches 233 and 234 are closed by corresponding surrounding flat portions of sheet 210 to form opposing side channels 133 and 134. Side channels 133 and 134 are angled toward central channel 132, and converge at a point adjacent to notch 235, which cooperates with sheet 210 to form outlet orifice 135. Although the disclosed embodiment depicts three intercommunicating trenches/channels arranged in an arrowhead shape, aspects of the present invention apply to any number of trenches/channels (e.g., one single trench/channel communicating with outlet orifice 135).

Referring again to FIG. 1, in accordance with another aspect of the present invention, extrusion head 130 is moved relative to substrate 101 (e.g., in the direction of arrow A) while one or more extrusion materials (not shown) are forced through fluidic channels 132, 133 and 134 such that the material is extruded from outlet orifice 135 and forms an associated extruded structure 120 on substrate 101. Mechanisms for generating the required relative movement between substrate 101 and extrusion head 130 are well known. The extrusion material is forced through inlets located adjacent to the closed ends of each fluidic channel 132, 133 and 134 using known techniques. Referring to FIG. 2, the inlet ports used to communicate with the fluidic channels are etch or otherwise formed in the various sheets. In particular, sheet 210 defines inlet ports (e.g., through holes, slots or channels) 213 and 214 that are aligned with the closed ends of trenches 233 and 234, respectively, and sheet 220 defines an inlet port 222-1 that is aligned with central trench 232. An inlet opening 222-2 is formed inside central trench 232 that extends through the thin remaining wall of sheet 230 and aligns with inlet port 222-1 when sheets 210 and 230 are joined. Inlet ports 213, 214, 222-1 and 222-2 are formed, for example, using micro-machining techniques (e.g., photo-chemical machining, pulsed laser machining, deep reactive ion etching, electro-discharge machining or anisotropic etching).

Figure 12A:
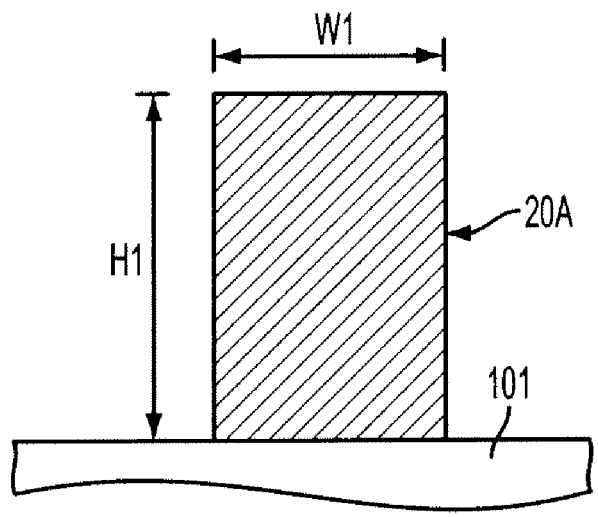
FIGS. 12(A) and 12(B) are simplified cross-sectional side views showing extruded structures formed by the conventional head shown in FIG. 11.
Figure 12B:
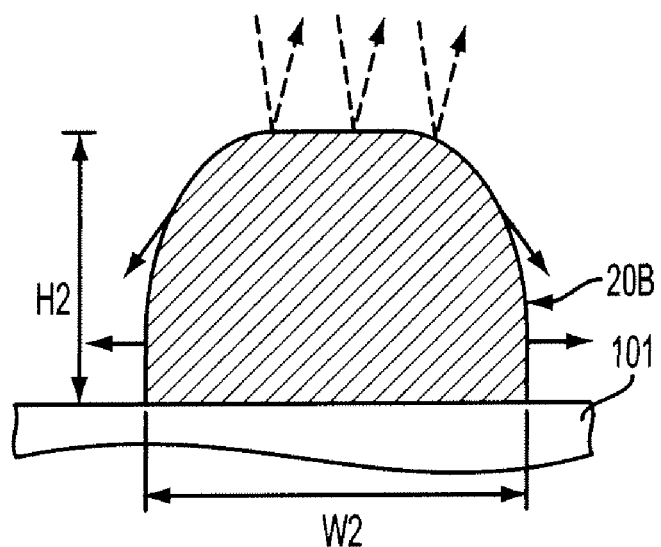

In accordance with another aspect of the invention, due to the shape of fluidic channels 132, 133 and 134 and outlet orifice 135, extruded structure 120 (shown in FIG. 1) has an equilibrium shape upon extrusion, thus avoiding the settling problems associated with conventional micro extrusion techniques. In particular, extruded structure 120 has a flat lower surface 126 (i.e., the surface in contact with upper surface 102 of substrate 101) that is formed by flat edge 136 of outlet orifice 135, and a curved or tapered upper surface 127 that is formed by the oblique edge 137 of outlet orifice 135 and faces away from substrate 101. In contrast to the rectangular shaped initial extrusion structure 20A (FIG. 12(A)) generated by conventional micro extrusion techniques which is subject to settling, extruded structure 120 is extruded in a shape that is close to structural equilibrium, thereby resisting settling and facilitating the production of extruded structures that have a relatively uniform and reliably consistent height and width.

In addition to the laminated metal layer arrangement depicted in FIG. 1, extrusion head 130 can be manufactured a variety of ways. For example, rounded channels can be formed by electroforming metal over resist structures that have been reflowed above their glass transition temperature. Tapered channels can also be formed by electroforming metal over resist structures that are processed using known techniques for creating a tapered sidewall. In another embodiment, an extrusion head formed in accordance with the present invention can be manufactured by brazing together layers of etched sheet metal. In yet another instance, the heads can be manufactured by generating structures out of photo-definable polymer such as SU8. In still another instance, the heads can be machined or molded out of metal and/or plastic using conventional manufacturing techniques.

Figure 3:
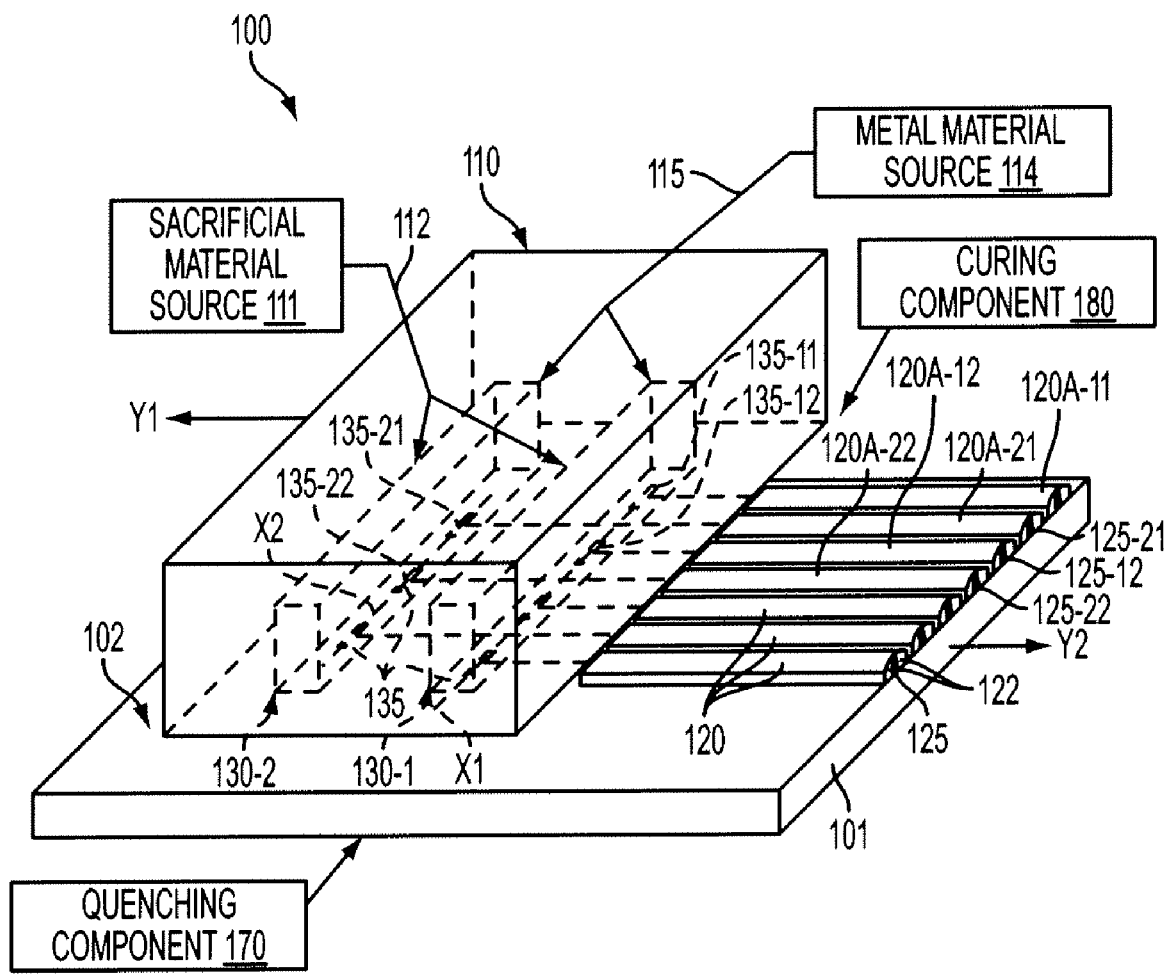
FIG. 3 is a perspective view showing a micro extrusion apparatus including the co-extrusion head of FIG. 1 for concurrently applying two or more materials on a substrate.

FIG. 3 illustrates micro extrusion apparatus 100A in accordance with another embodiment of the present invention. Apparatus 100A includes an extrusion device 110 having one or more co-extrusion heads 130-1 and 130-2 fixedly mounted thereon, each co-extrusion head 130-1 and 130-2 being consistent with extrusion head 130, described above. In the present embodiment, extrusion device 110 is coupled to a first source 111 containing a support material 112, and a second source 114 containing a functional ("gridline") material 115. Extrusion heads 130-1 and 130-2 are operably coupled to sources 111 and 114 such that heads 130-1 and 130-2 concurrently apply support material 112 and a gridline material 115 onto the upper surface 102 of a substrate 101. The materials are applied through pushing and/or drawing techniques (e.g., hot and cold) in which the materials are pushed (e.g., squeezed, etc.) and/or drawn (e.g., via a vacuum, etc.) through extrusion device 110 and/or co-extrusion heads 130-1 and 130-2, and out outlet orifices 135 that are respectively defined in a lower portion of co-extrusion heads 130-1 and 130-2.

In one embodiment, co-extrusion heads 130-1 and 130-2 are held by extrusion device 110 such that their respective outlet orifices are arranged in a parallel, spaced-apart arrangement. In particular, the (first) outlet orifices of co-extrusion head 130-1 (e.g., outlet orifices 135-11 and 135-12) extending in a first direction X1, and the (second) outlet orifices of the second co-extrusion head 130-2 (e.g., outlet orifices 135-21 and 135-22) define a second line X2 that is separated from and parallel to first line X1. As set forth in co-pending U.S. patent application Ser. No. 11/555,479, entitled "CLOSELY SPACED, HIGH-ASPECT EXTRUDED GRIDLINES" which is incorporated herein by reference in its entirety, apparatus 100A includes a mechanism (not shown) for moving extrusion device 110 (and, hence, co-extrusion heads 130-1 and 130-2) in a direction that is perpendicular to the alignment direction of the outlet orifices, and gridline material 115 and support material 112 are co-extruded through outlet orifices 135 in a manner that creates parallel, elongated extruded structures 120A on substrate 101 such that the gridline material of each structure 120A forms a high-aspect ratio gridline structure 125, and the support material of each structure 120A forms associated first and second support material portions 122 respectively disposed on opposing sides of the associated high-aspect ratio gridline 125. The shape of extruded structures 120A (i.e., the aspect ratio of gridline 125 and the shape of support portions 122) are controlled by the shape outlet orifices 135 and the fluidic channels inside heads 130-1 and 130-2, characteristics of the materials (e.g., viscosity, etc.), and the extrusion technique (e.g., flow rate, pressure, temperature, etc.) to achieve the equilibrium shape mentioned above and described in additional detail below. The structure within heads 130-1 and 130-2 and the shape of outlet orifices 135 is consistent with that described above with reference to FIGS. 1 and 2. Suitable gridline materials 115 include, but are not limited to, silver, copper, nickel, tin, aluminum, steel, alumina, silicates, glasses, carbon black, polymers and waxes, and suitable support materials 112 include plastic, ceramic, oil, cellulose, latex, polymethylmethacrylate etc., combinations thereof, and/or variations thereof, including combining the above with other substances to obtain a desired density, viscosity, texture, color, etc. The outlet orifices of co-extrusion heads 130-1 and 130-2 are disposed in a staggered arrangement to simultaneously generate extrusion structures 120A that are closely spaced, thus facilitating the production of high aspect-ratio gridlines 125 are formed on substrate 101 at a pitch that is not possible using conventional methods. In another embodiment of the present invention, a single head may be used to produce extrusion structures 120A that are spaced relatively far apart.

To limit the tendency for the materials to intermix after extrusion, extruded structures 120A leaving extrusion heads 130-1 and 130-2 can be quenched on substrate 101 by cooling the substrate using, for example, a quenching component 170. Alternately, the ink/paste used in this application may be a hot-melt material, which solidifies at ambient temperatures, in which case the printheads 130-1 and 130-2 are heated, leaving the extruded structures 120A to solidify once they are dispensed onto the substrate 101. In another technique, the materials can be cured by thermal, optical and/or other means upon exit from extrusion heads 130-1 and 130-2. For example, a curing component 180 can be provided to thermally and/or optically cure the materials. If one or both materials include an ultraviolet curing agent, the material can be bound up into solid form in order to enable further processing without mixing.

Figure 4A:
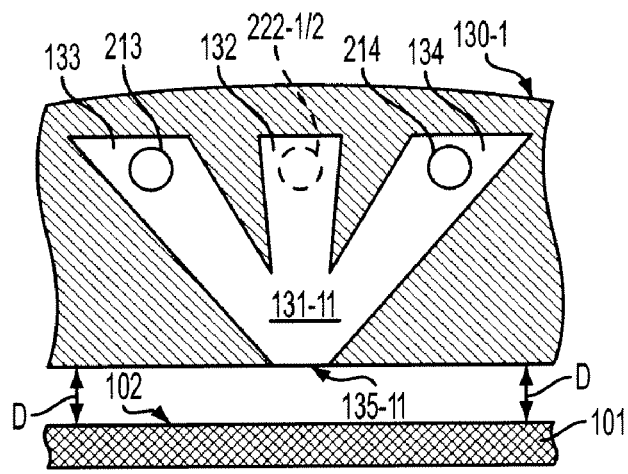
FIGS. 4(A) and 4(B) are cross-sectional side views showing a three-channel cavity defined in the co-extrusion head of FIG. 1.

FIG. 4(A) shows a portion of co-extrusion head 130-1 including fluidic channel 130-11 positioned over substrate 101 prior to generation of metal gridlines. Co-extrusion head 130-1 is maintained at a substantially fixed distance D over upper surface 102 of substrate 101 during the extrusion process (i.e., while co-extrusion head 130-1 is moved relative to substrate 101 in the manner described above). The distance D between the head 130-1 and the substrate 101 can be based on various factors, such as the angle of the dispensing end of the head 130-1 with respect to upper surface 102 (e.g., from parallel to perpendicular), in order to increase transfer efficiency, entity definition (e.g., width, height, length, diameter, etc), entity characteristics (e.g., strength, pliability, etc.), etc. Note that distance D must be greater than or equal to the height H (shown in FIG. 5) of extruded structure 120-11 in order to facilitate the staggered extrusion head arrangement shown in FIG. 3.

Figure 4B:
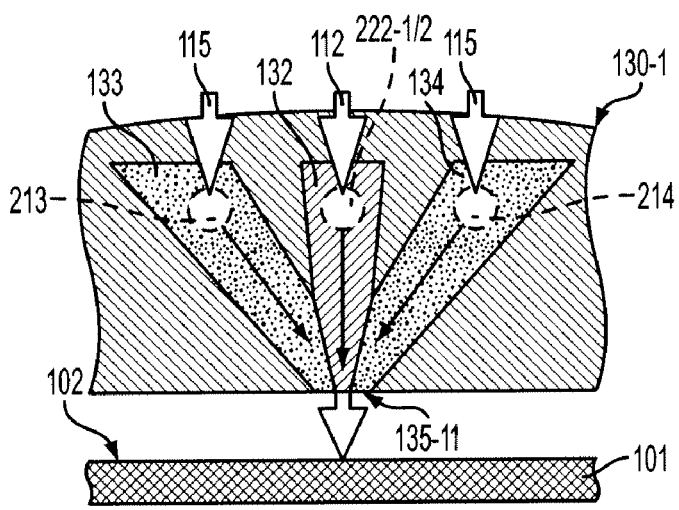

FIG. 4(B) shows the same portion of co-extrusion head 130-1 at the onset of the co-extrusion process. As indicated by the white arrows, gridline material 115 is forcibly injected through the first inlet ports 222-1 and 222-2 (see FIG. 2) into the closed end of central channel 132, and support material 112 is simultaneously forcibly injected through inlet ports 213 and 214 into side channels 133 and 134, respectively. As indicated by the dark arrows in FIG. 4(B), the injected materials travel downward along their respective channels. The gridline and support materials are compressed by the tapered shapes of channels 132, 133 and 134. The gridline material is further compressed by the converging support material flowing along side channels 133 and 134 as the materials approach outlet orifice 135-11. The compressed flow is then extruded from outlet orifice 135-11 and is deposited on substrate 101 as extruded structure 120A-11 (shown in FIG. 5). Intermixing between the gridline and support materials is minimized by choosing appropriate materials and viscosities, by appropriately tapering the channels, and/or by maintaining laminar flow conditions.

Figure 5:
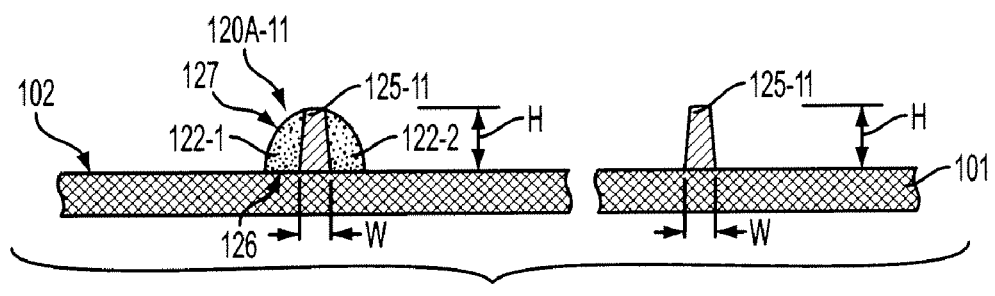
FIG. 5 is a cross-sectional side view showing an exemplary co-extruded gridline structure that was generated on a substrate surface by the co-extrusion head of FIG. 4(B)

FIG. 5 is a cross-sectional side view showing an exemplary extruded structure 120A-11 produced in accordance with the co-extrusion process described with reference to FIG. 4(B). Extruded structure 120A-11 includes a gridline 125-11 disposed between support material portions 122-1 and 122-2. Due to the trench shape and converging forces generated by three-branch fluidic channel 130-11 (FIGS. 4(A) and 4(B)) leading to outlet orifice 135-11, extruded structure 120A-11 exhibits advantages over gridlines formed by conventional methods. That is, in addition to having a flat lower surface 126 and curved or tapered upper surface 127 characteristic of the equilibrium shape described above, extrusion head 130-1 facilitates the formation of gridline 125-11 with an aspect ratio (height H to width W) of 2:1 or greater in a single pass, which is not possible using conventional methods. The width W of gridline 125-11 can be made narrower (finer) than the smallest minimum design feature of extruder head 130-11. Due to the equilibrium shape, support material portions 122-1 and 122-2 reliably retain the high-aspect ratio shape of gridline 125-11 as long as needed before or during subsequent processing such as drying, curing, and/or sintering. As shown on the right side of FIG. 5, the support portions are then removed, thus providing high aspect-ratio gridline 125-11 with the desired height H and width W. A further advantage of support material portions 122-1 and 122-2 is that the added material leads to an overall larger outlet orifice 135-11, and hence a lower pressure drop for a given material flow speed.

Higher process speed is therefore achievable. In addition, the compressing flow can be manipulated to form metal gridline 125-11 with a tapered cross-section (e.g., with a relatively wide base disposed on substrate surface 102, a relatively narrow upper end, and tapered sides that extend at an angle relative to surface 102 from the base end to the upper end). This tapered shape facilitates directing photons into substrate 101, and reduces the photon blocking (shading) caused by the gridlines, which can improve efficiency and/or generation of electrical power.

Figure 6:
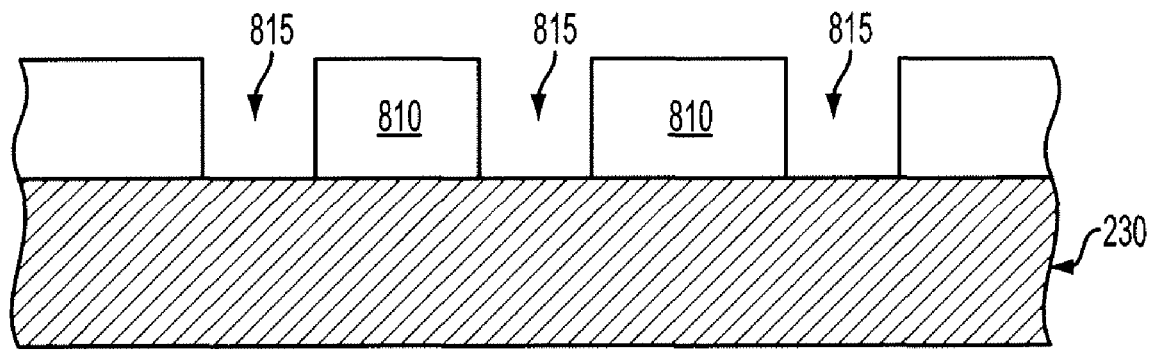
FIG. 6 is a cross-sectional side view showing a sheet including a first mask used to form trenches according to an embodiment of the present invention.
Figure 7:
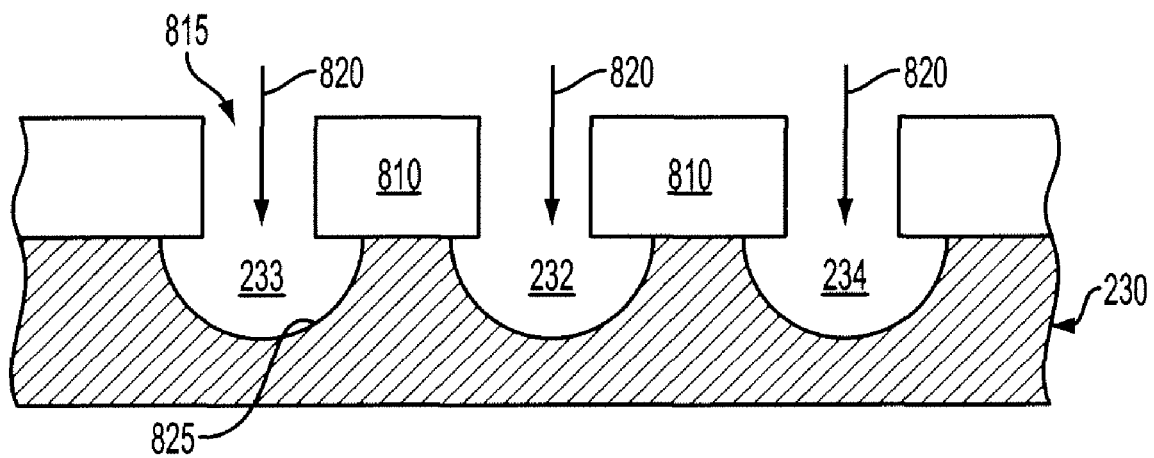
FIG. 7 is a cross-sectional side view showing an etching process for forming trenches using the first mask shown in FIG. 6.

FIGS. 6 and 7 are cross-sectional side views illustrating the formation of elongated trenches 232, 233 and 234 in sheet 230 according to another embodiment of the present invention. As shown in FIG. 6, a mask 810 is patterned over a surface of sheet 230 such that windows 815 expose elongated regions of sheet 230 corresponding to the desired elongated trenches. Next, an etchant 820 is applied over mask 810 such that etchant 820 enters into windows 815 and isotropically etches sheet 820, thereby forming the desired oblique trenches 232, 233 and 234 (FIG. 7). In one embodiment, sheet 230 is 316L stainless steel having a thickness of 0.010 inches, and etchant 820 is ferric chloride, which is applied through windows 815 having a width of 0.002 inches. Various modifications to the etching process may be used to alter the curved or tapered shape of the elongated trenches, such as using laser abalation instead of chemical etching, or electroplating the structure after the machining process.

Figure 8:
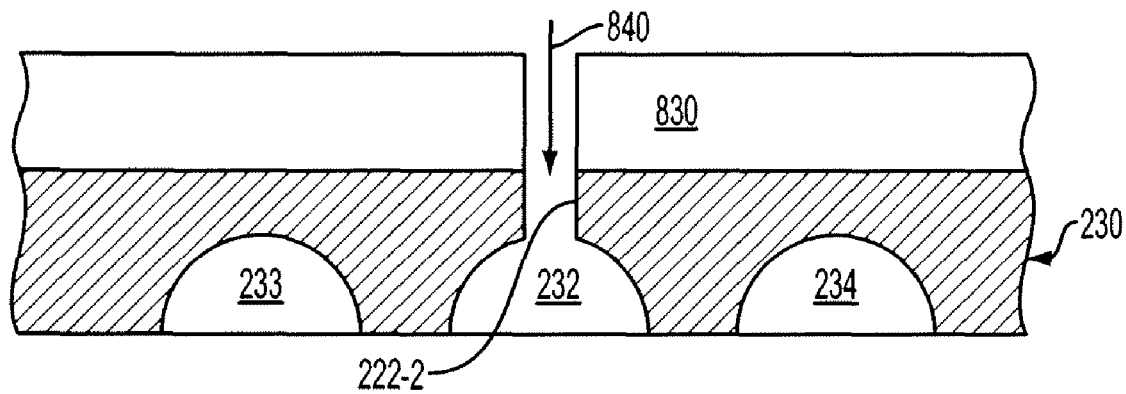
FIG. 8 is a cross-section side view showing a second mask and second etching process used to form an inlet opening into a central trench of the sheet shown in FIG. 7.

As depicted in FIG. 8, a second mask 830 is patterned over surface 231-1, and a second etchant 840 is used to form inlet opening 222-2 (FIG. 2). This pattern is preferably applied using a two-sided mask aligner. The second etching step can be performed simultaneously or in sequence with the first etching step.

Figure 9:
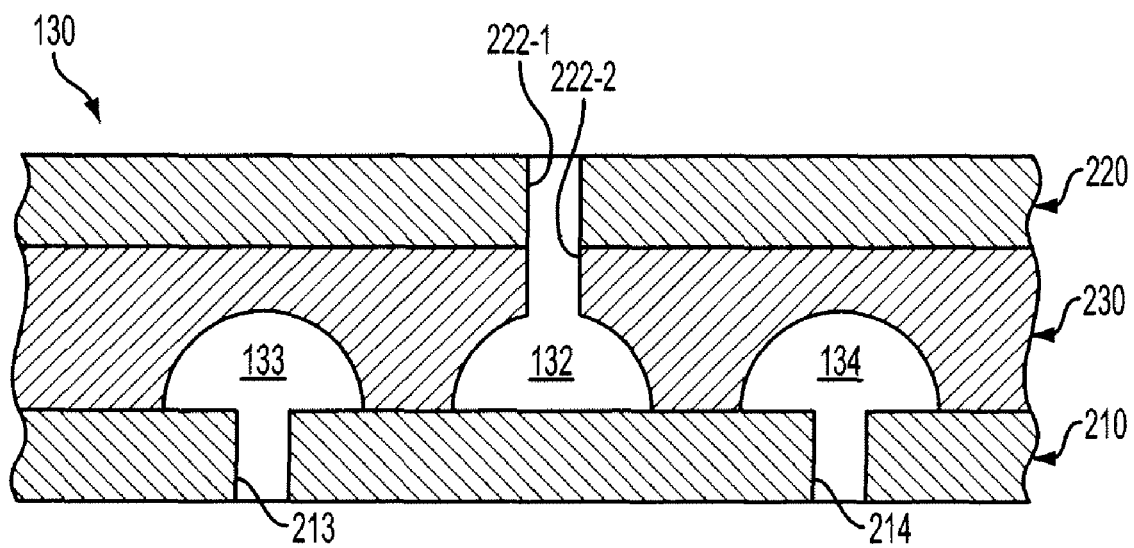
FIG. 9 is a cross-sectional side view showing a portion of an extrusion head including the sheet formed in FIG. 8.

FIG. 9 depicts a portion of the fully-assembled extrusion head 130 including first sheet 210 and second sheet 220 disposed on opposing surfaces of sheet 230. Note that sheet 220 includes opening 222-1 (described above), which aligns with inlet opening 222-2 to facilitate injection of gridline material into central channel 132. Similarly, sheet 210 includes openings 213 and 214 (described above), which facilitate injection of gridline material into side channels 133 and 134, respectively.

Figure 10:
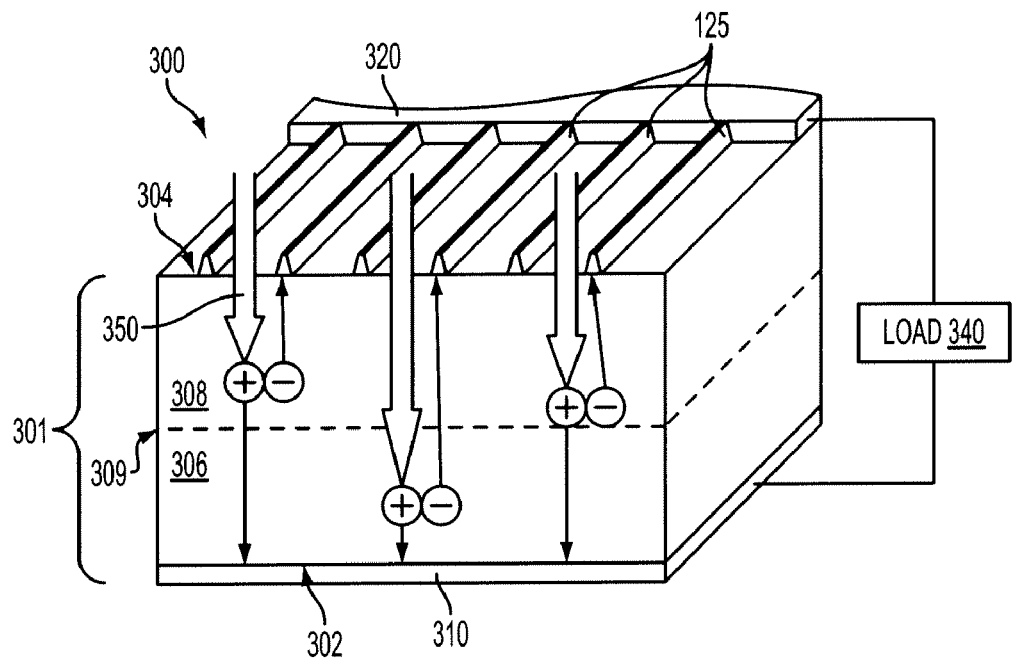
FIG. 10 illustrates a photovoltaic cell including gridlines formed in accordance with the present invention.
Figure 11:
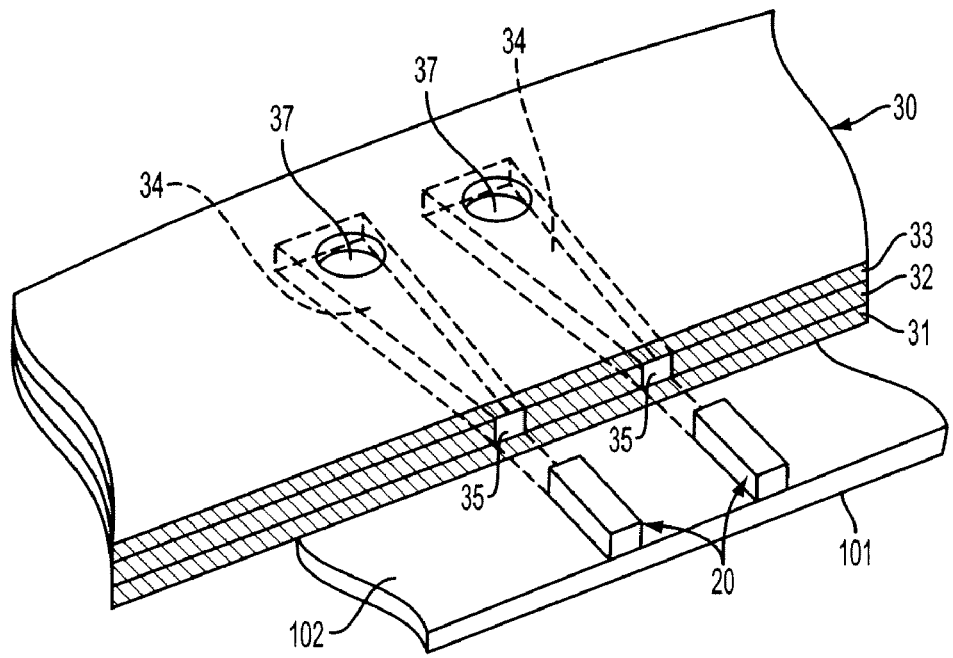
FIG. 11 is perspective view showing a portion of a conventional micro extrusion head.

FIG. 10 illustrates an exemplary portion of a photovoltaic cell 300, such as a solar cell, with high-aspect metal gridlines 125 created via co-extrusion head 130 according to an embodiment of the present invention. Photovoltaic cell 300 includes a semiconductor substrate 301 with a p-type region 306 and an n-type region 308. One or both of the regions 306 and 308 of substrate 301 is formed from semiconductor materials such as, for example, Aluminum Arsenide, Aluminum Gallium Arsenide, Boron Nitride, Cadmium Sulfide, Cadmium Selenide, Copper Indium Gallium Selenide, Diamond, Gallium Arsenide, Gallium Nitride, Germanium, Indium Phosphide, Silicon, Silicon Carbide, Silicon Germanium, Silicon on insulator, Zinc Sulfide, Zinc Selenide, etc. A lower contact 310 is formed on a lower surface 302 of substrate 301 (i.e., at a lower end of p-type region 306). Metal gridlines 125 and one or more bus bars 320 are formed on an upper surface 304 of substrate 301 (i.e., at a lower end of n-type region 308). Contact 310 and bus bars 320 can be formed using a metal paste such as a silver based paste or an aluminum based paste.

Photovoltaic cell 300 can be interconnected with other photovoltaic cells (not shown) in series and/or parallel, for example, via flat wires or metal ribbons, and assembled into modules or panels and connected as indicated to a load 340. A sheet of tempered glass (not shown) may be layered over the gridlines 125 and/or a polymer encapsulation (not shown)

may be formed over the contact 310. Upper surface 304 may include a textured surface and/or be coated with an antireflection material (e.g., silicon nitride, titanium dioxide, etc.) in order to increase the amount of light absorbed into the cell.

During operation, when photons 350 (indicated by wide arrows) are directed into substrate 301 through upper surface 304, their energy excites electron-hole pairs therein, which subsequently freely move. In particular, absorption of a photon creates an electric current through the p-n junction (depicted by the migrating + and − charges). Electrical current is generated when excited electrons in the n-type region 308 travel through gridlines 125, bus bar 320, and the electrodes to external load 340 and back through the lower electrode and contact 310 to the p-type region 306.

By way of example, a co-extrusion head with the estimated parameters illustrated in Table 1 could be used to dispense the materials to make gridlines 125 on a crystalline silicon solar cell.

TABLE 1

Exemplary head parameters for generating a gridline.

| | |
|---|---|
| Sheet Thickness | 152 microns |
| Gridline Pitch | 2.5 mm |
| Head Speed | 1 cm/sec |
| Past Viscosity | 100,000 Cp |
| Head Angle | 45 degrees |
| Head Exit Width | 304.8 Microns |
| Silver Width | 49.2 microns |
| Silver Line Cross Section | 7,500 microns^2 |
| Silver Line Aspect Ratio | 3.10:1 |
| Silver Flow | 0.075 mm^3/sec |
| Head Compression | 6.2:1 |
| Head Pressure Drop | 2.24 atm |

With this design, convergent channels are patterned into a sheet of material with a thickness of approximately 0.15 mm. The outlet orifices of the head/nozzles are repeated on a pitch of 2.5 mm. At a head/nozzle pressure of approximately 2.24 atmospheres, paste of 1000 poise is ejected at a rate of 1 cm/sec. The central stripe of silver is approximately 50 microns wide with an aspect ratio of 3:1.

Figure 13:
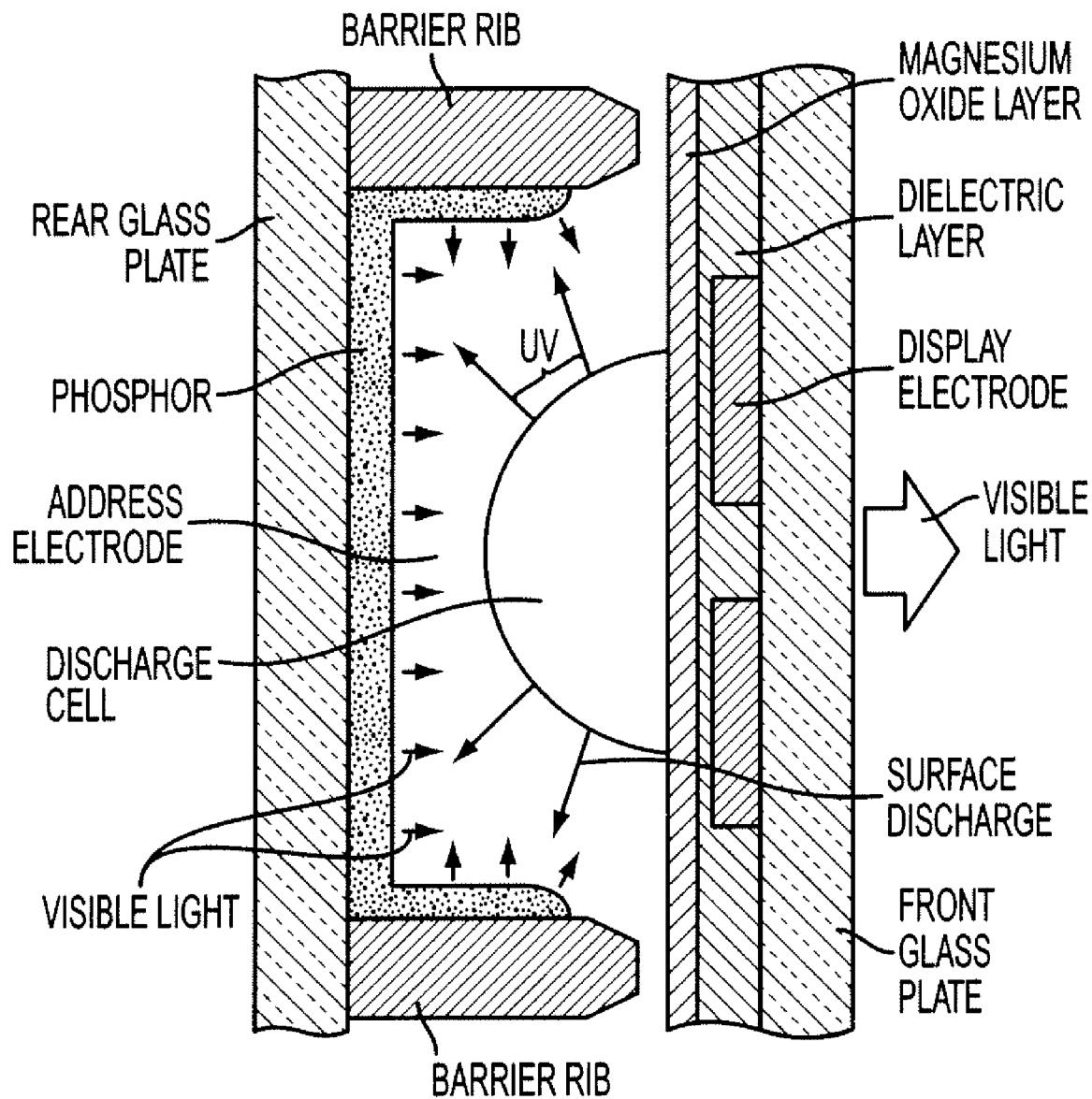
FIG. 13 is a simplified cross-sectional side view showing a portion of an exemplary plasma display panel.

Although the present invention has been described with respect to certain specific embodiments, it will be clear to those skilled in the art that the inventive features of the present invention are applicable to other embodiments as well, all of which are intended to fall within the scope of the present invention. For example, in addition to striped materials with a lateral variation, variations of head 130 may be used to additionally and/or alternatively introduce materials with a vertical variation, for example, for introducing barrier layers onto the substrate. Such vertical variation can be implemented by forming channels that converge dissimilar materials together in the vertical direction (in addition to converging in the horizontal direction) within the manifold. For instance, with a solar cell application, it may be advantageous to introduce a metal bi-layer onto the cell surface with one metal making contact to the silicon as a diffusion barrier, and a second metal on top selected for either lower cost or higher conductance. Further, in addition to metal gridlines, the methods and structures described herein may be utilized to generate gridlines formed from electrically non-conductive materials, such as inorganic glasses that are used, for example, to produce the barrier rib structures described with reference to FIG. 13.

Furthermore, although in the examples provided, the side and central channels are fed from opposite faces of the extrusion apparatus, it is clear that with the necessary modifications, the side and central channels can also be fed from a common side, making it possible to extrude material at a grazing angle to the substrate.

The invention claimed is:

1. A micro extrusion apparatus for producing an extruded structure having an equilibrium shape on a substrate, the micro extrusion apparatus comprising:
an extrusion head including:
a first sheet having a first surface and a first side edge;
a second sheet having a second surface and a second side edge,
wherein the second sheet is mounted on the first sheet such that a flat portion of the second surface abuts the first surface, and
wherein the second surface of the second sheet defines an elongated trench extending from the second side edge and having a concave oblique surface, thereby forming a fluidic channel having an outlet orifice including a straight first edge defined by the first sheet, and an oblique second edge defined by the elongated trench; and
means for moving the extrusion head relative to the substrate while forcing material through the fluidic channel such that material is extruded from the outlet orifice and forms an associated extruded structure on the substrate, wherein the extruded structure has a flat lower surface that is formed by the straight first edge of the orifice and is in contact with the substrate, and an upper surface that is formed by the oblique second edge of the outlet orifice and faces away from the substrate,
wherein the fluidic channel comprises a three-channel cavity including a central channel and opposing first and second side channels, wherein the central channel comprises the elongated trench, and the first and second side channels comprise second and third elongated trenches, and wherein the central channel and the first and second side channels communicate with the outlet orifice, and
wherein the apparatus further comprises means for injecting functional material into the central channel of the three-channel cavity while injecting support material into the first and second side channels of said three-channel cavity such that said functional material extruded from the outlet orifice forms an associated high aspect-ratio functional structure of said extruded structure, and said support material extruded from the outlet orifice forms associated first and second support material portions respectively disposed on opposing sides of said associated functional structure,
wherein the first sheet defines a first and second inlet ports respectively communicating with the first and second side channels of the three-channel cavity, and the extrusion head further comprises a third sheet having a third inlet port communicating with the central channel of the three-channel cavity,
wherein said means for injecting the functional material and the support material comprises means for forcing the functional material through the third inlet port into the central channel while forcing the support material through the first and second inlet ports into the first and second side channels, respectively,
wherein the second sheet further defines an inlet opening disposed in the elongated trench and extending entirely through the second sheet, and
wherein said means for injecting the functional material includes means for forcing the functional material through both the third inlet port and the inlet opening into the central channel.

2. The apparatus of claim 1, further comprising at least one of means for heating the extrusion materials before extrusion, means for cooling the substrate during extrusion, and means for curing the extruded material.

3. The micro extrusion system according to claim 1, wherein the first and second sheets comprise metal plates.

* * * * *